(12) United States Patent
Shimomura et al.

(10) Patent No.: US 11,610,617 B2
(45) Date of Patent: Mar. 21, 2023

(54) MAGNETIC MEMORY

(71) Applicant: Kioxia Corporation, Tokyo (JP)

(72) Inventors: Naoharu Shimomura, Tokyo (JP); Michael Arnaud Quinsat, Yokohama Kanagawa (JP); Masahiro Koike, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 17 days.

(21) Appl. No.: 17/349,350

(22) Filed: Jun. 16, 2021

(65) Prior Publication Data

US 2022/0076723 A1 Mar. 10, 2022

(30) Foreign Application Priority Data

Sep. 7, 2020 (JP) .............................. JP2020-150007

(51) Int. Cl.
| | |
|---|---|
| *G11C 11/16* | (2006.01) |
| *H01L 27/22* | (2006.01) |
| *G11C 11/18* | (2006.01) |
| *H01L 43/06* | (2006.01) |
| *H01L 43/02* | (2006.01) |

(52) U.S. Cl.
CPC ........ *G11C 11/1675* (2013.01); *G11C 11/161* (2013.01); *G11C 11/18* (2013.01); *H01L 27/222* (2013.01); *H01L 43/02* (2013.01); *H01L 43/06* (2013.01)

(58) Field of Classification Search
CPC ... G11C 11/1675; G11C 11/161; G11C 11/18; H01L 27/222; H01L 43/06; H01L 43/08
USPC .................................................. 365/158, 173
See application file for complete search history.

(56) References Cited

U.S. PATENT DOCUMENTS

| | | | |
|---|---|---|---|
| 7,633,795 B2 | 12/2009 | Shimomura et al. | |
| 7,813,164 B2* | 10/2010 | Sugibayashi | G11C 11/15 365/158 |
| 8,320,152 B2* | 11/2012 | Cho | G11C 19/0808 365/81 |
| 8,363,461 B2 | 1/2013 | Suzuki et al. | |
| 8,432,719 B2* | 4/2013 | Lue | G11C 16/0416 365/185.26 |
| 10,229,920 B1* | 3/2019 | Cheng | H01L 27/0922 |
| 10,332,881 B1* | 6/2019 | Badaroglu | H01L 21/823412 |
| 10,431,303 B2 | 10/2019 | Nozaki et al. | |

(Continued)

FOREIGN PATENT DOCUMENTS

| | | |
|---|---|---|
| JP | H3-238688 A | 10/1991 |
| JP | 2007-188578 A | 7/2007 |

(Continued)

*Primary Examiner* — Michael T Tran

(74) *Attorney, Agent, or Firm* — Finnegan, Henderson, Farabow, Garrett & Dunner, LLP

(57) ABSTRACT

A magnetic memory according to an embodiment includes: a first wiring and a second wiring; a first magnetic member having a first portion electrically connected to the first wiring and a second portion electrically connected to the second wiring, the first magnetic member extending in a first direction from the first portion to the second portion; a third wiring that is electrically insulated from the first magnetic member; and a control circuit electrically connected to the first wiring, the second wiring, and the third wiring, the control circuit supplying a current pulse, in which a trailing time is longer than a rising time, to the third wiring.

22 Claims, 16 Drawing Sheets

(56) References Cited

U.S. PATENT DOCUMENTS

| | | | | |
|---|---|---|---|---|
| 10,483,200 B1* | 11/2019 | Yang | | H01L 23/528 |
| 2006/0171198 A1* | 8/2006 | Saito | | H01L 27/228 |
| | | | | 365/158 |
| 2007/0058424 A1* | 3/2007 | Inaba | | G11C 11/16 |
| | | | | 365/158 |
| 2009/0161422 A1* | 6/2009 | Zhu | | G11C 11/161 |
| | | | | 365/171 |
| 2009/0285009 A1* | 11/2009 | Kim | | G11C 13/0023 |
| | | | | 365/226 |
| 2010/0172173 A1* | 7/2010 | Abu-Rahma | | G11C 11/1675 |
| | | | | 365/158 |
| 2011/0188305 A1* | 8/2011 | Yang | | G11C 11/1673 |
| | | | | 365/171 |
| 2012/0063195 A1* | 3/2012 | Lam | | G11C 11/5678 |
| | | | | 365/148 |
| 2012/0075921 A1* | 3/2012 | Tanizaki | | G11C 11/1675 |
| | | | | 365/158 |
| 2012/0243308 A1* | 9/2012 | Saida | | G11C 11/1655 |
| | | | | 257/E29.323 |
| 2013/0058161 A1* | 3/2013 | Yamanaka | | G11C 11/5607 |
| | | | | 257/E21.665 |
| 2013/0070523 A1* | 3/2013 | Saida | | G11C 11/161 |
| | | | | 365/173 |
| 2014/0085968 A1* | 3/2014 | Saida | | G11C 11/161 |
| | | | | 365/158 |
| 2016/0118404 A1* | 4/2016 | Peng | | H01L 27/11587 |
| | | | | 257/295 |
| 2017/0077394 A1* | 3/2017 | Saida | | G11C 11/1659 |
| 2018/0061759 A1* | 3/2018 | Li | | H01L 27/0886 |
| 2018/0123038 A1* | 5/2018 | Lee | | H01L 27/2463 |
| 2019/0006416 A1* | 1/2019 | Lee | | G11C 11/18 |
| 2019/0088289 A1* | 3/2019 | Ishii | | G11C 13/004 |
| 2019/0157554 A1* | 5/2019 | Mo | | H01L 45/04 |
| 2019/0206888 A1* | 7/2019 | Peng | | H01L 29/7883 |
| 2020/0160927 A1* | 5/2020 | Jung | | G11C 29/06 |
| 2020/0258881 A1* | 8/2020 | Lilak | | H01L 29/0821 |
| 2020/0312658 A1* | 10/2020 | Miura | | H01L 29/1054 |
| 2020/0343144 A1* | 10/2020 | Li | | H01L 21/823481 |
| 2020/0402989 A1* | 12/2020 | Kawashima | | H01L 29/40117 |
| 2020/0403073 A1* | 12/2020 | Mihara | | H01L 29/7851 |
| 2021/0098041 A1* | 4/2021 | Kim | | G06F 12/0238 |
| 2021/0389395 A1* | 12/2021 | Suemitsu | | H01L 43/08 |
| 2022/0069010 A1* | 3/2022 | Lee | | H01L 43/02 |
| 2022/0108997 A1* | 4/2022 | Hekmatshoartabari | | |
| | | | | H01L 29/66825 |
| 2022/0199828 A1* | 6/2022 | Mehrotra | | H01L 27/0886 |

FOREIGN PATENT DOCUMENTS

| | | |
|---|---|---|
| JP | 2013-97842 A | 5/2013 |
| JP | 5488465 B2 | 5/2014 |
| JP | 2018-92696 A | 6/2018 |
| JP | 2019-33121 A | 2/2019 |

* cited by examiner

B-B CROSS SECTION

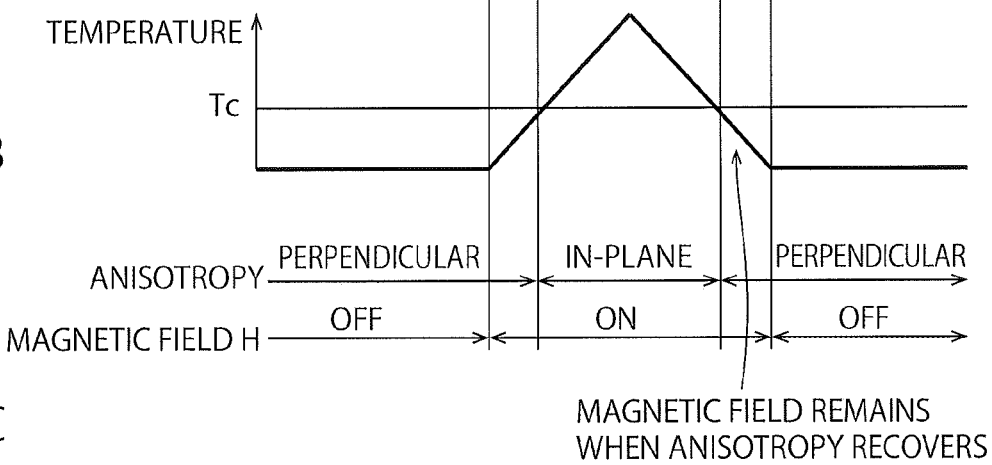
FIG. 7A
FIG. 7B
FIG. 7C
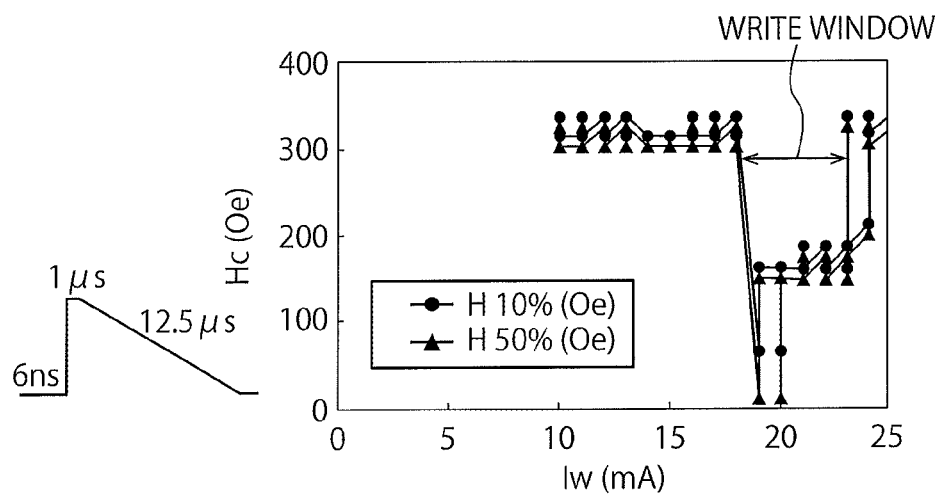
FIG. 8A  FIG. 8B

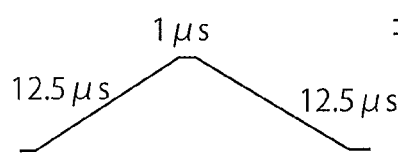
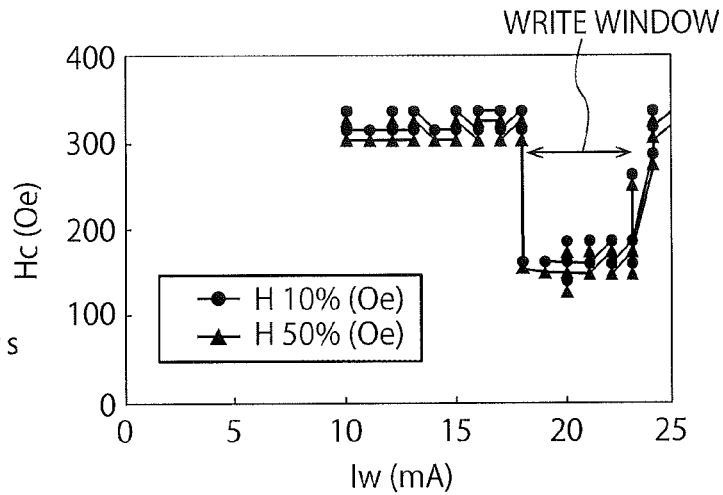
FIG. 9A       FIG. 9B
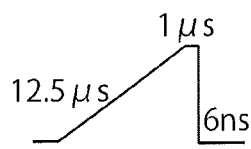
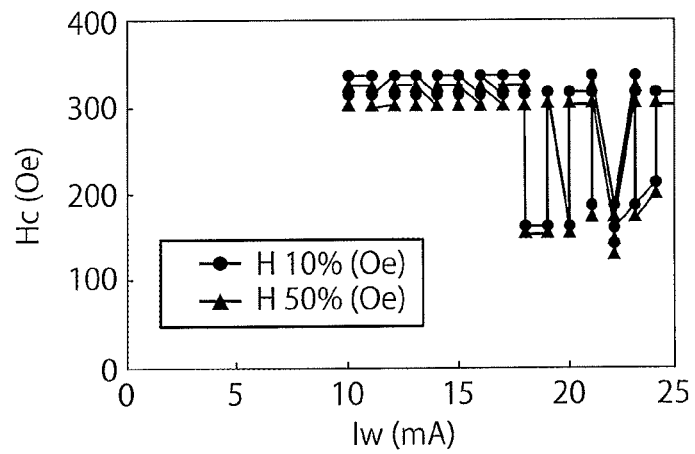
FIG. 10A      FIG. 10B

TRAILING TIME

US 11,610,617 B2

MAGNETIC MEMORY

CROSS REFERENCE TO RELATED APPLICATIONS

This application is based upon and claims the benefit of priority from the prior Japanese Patent Application No. 2020-150007, filed on Sep. 7, 2020, the entire contents of which are incorporated herein by reference.

FIELD

Embodiments described herein relate generally to magnetic memories.

BACKGROUND

A magnetic memory is known, in which domain walls of a magnetic member are moved (shifted) due to a current caused to flow through the magnetic member. A field line used for writing information (magnetization direction), for example, is disposed near an end of the magnetic member that extends in a predetermined direction in the magnetic memory. The domain walls of a magnetic member are moved when a shift current for shifting the domain walls flows between a first end and a second end of the magnetic member.

The magnetic memory including such a configuration has a problem of the occurrence of a write error.

BRIEF DESCRIPTION OF THE DRAWINGS

FIGS. 7A to 7C are diagrams used for explaining that no write error occurs when a triangular write pulse is used.

FIGS. 8A and 8B are diagrams showing a write pulse which steeply rises and gradually falls, and the result of a write operation using this write pulse.

FIGS. 9A and 9B are diagrams showing a write pulse which gradually rises and gradually falls, and the result of a write operation using this write pulse.

FIGS. 10A and 10B are diagrams showing a write pulse which gradually rises and steeply falls, and the result of a write operation using this write pulse.

DETAILED DESCRIPTION

A magnetic memory according to an embodiment includes: a first wiring and a second wiring; a first magnetic member including a first portion electrically connected to the first wiring and a second portion electrically connected to the second wiring, the first magnetic member extending in a first direction from the first portion to the second portion; a third wiring that is electrically insulated from the first magnetic member; and a control circuit electrically connected to the first wiring, the second wiring, and the third wiring, the control circuit supplying a current pulse, in which a trailing time is longer than a rising time, to the third wiring.

First Embodiment

Figure 1A:
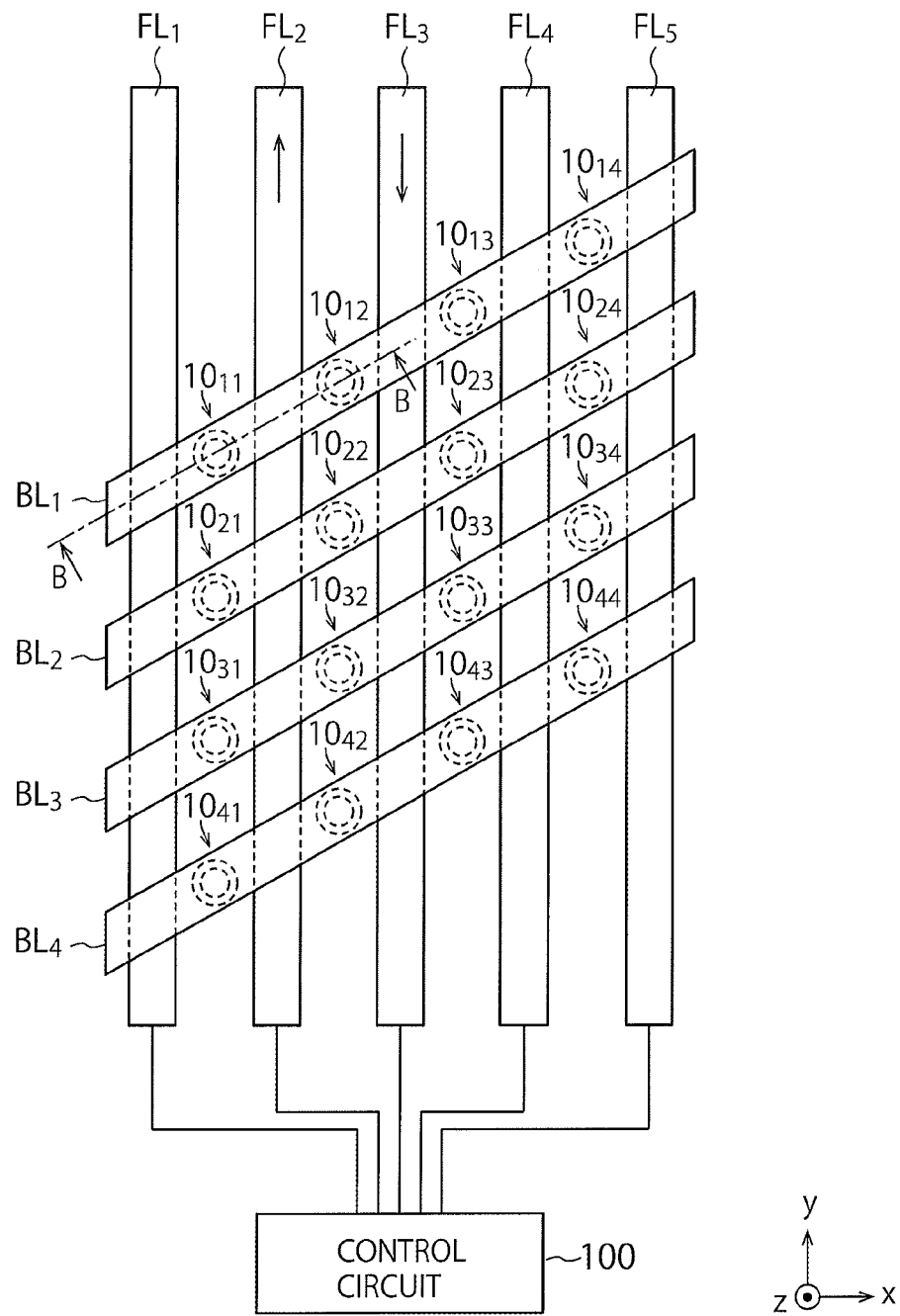
FIG. 1A is a plan view of a magnetic memory according to a first embodiment.
Figure 1B:
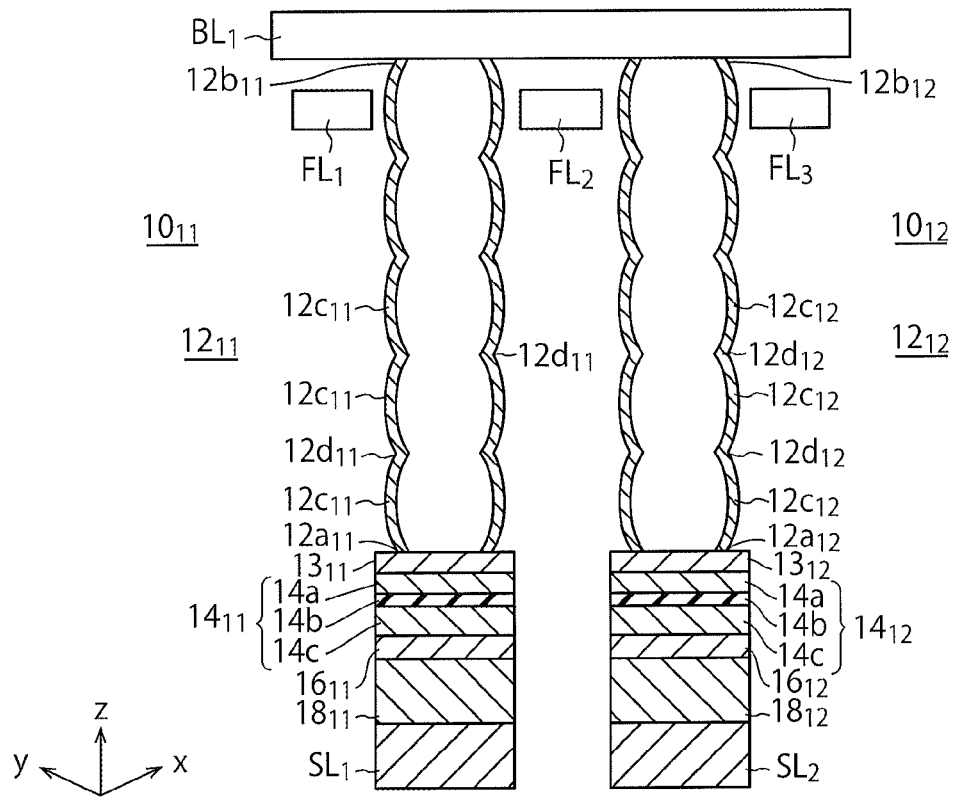
FIG. 1B is a cross-sectional view of the magnetic memory according to the first embodiment.

A magnetic memory according to a first embodiment of the present application will be described below. FIG. 1A is a plan view of the magnetic memory according to the first embodiment, and FIG. 1B is a cross-sectional view of the magnetic memory according to the first embodiment taken along line B-B in FIG. 1A. As shown in FIG. 1A, the magnetic memory according to the first embodiment includes memory cells $10_{11}$ to $10_{44}$ that are arranged in four rows and four columns. Although the magnetic memory according to the first embodiment includes memory cells that are arranged in four rows and four columns in the first embodiment, the memory cells may be arbitrarily arranged in m rows and n columns where m and n are natural numbers.

The memory cells $10_{i1}$ to $10_{i4}$ in the i-th row (i=1, . . . , 4) are arranged to have an angle with the horizontal direction (x axis direction) in FIG. 1. The memory cells $10_{1j}$ to $10_{4j}$ in the j-th column (j=1, . . . , 4) are arranged in the vertical direction (y axis direction) in FIG. 1. Thus, the memory cells in adjacent columns are arranged in the x axis direction so as to be shifted from each other. Such a configuration allows a dense arrangement of the memory cells.

Two field lines are provided for the memory cells $10_{1j}$, $10_{2j}$, $10_{3j}$, and $10_{4j}$ (j=1, . . . , 4) disposed in the j-th column (j=1, . . . , 4). For example, a field line $FL_2$ and a field line $FL_3$ are provided for the memory cells $10_{12}$, $10_{22}$, $10_{32}$, and $10_{42}$ disposed in the second column. The field line $FL_2$ is disposed in a region between the memory cells $10_{i1}$ ($i=1, \ldots, 4$) in the first column and the memory cells $10_{i2}$ ($i=1, \ldots, 4$) in the second column. The field line $FL_3$ is disposed in a region between the memory cells $10_{i2}$ ($i=1, \ldots, 4$) in the second column and the memory cells $10_{i3}$ ($i=1, \ldots, 4$) in the third column. A field line $FL_4$ is disposed in a region between the memory cells $10_{i3}$ ($i=1, \ldots, 4$) in the third column and the memory cells $10_{i4}$ ($i=1, \ldots, 4$) in the fourth column.

A field line $FL_1$ is disposed on the opposite side of the memory cells $10_{i1}$ ($i=1, \ldots, 4$) in the first column relative to the field line $FL_2$. A field line $FL_5$ is disposed on the opposite side of the memory cells $10_{i4}$ ($i=1, \ldots, 4$) in the fourth column relative to the field line $FL_4$. Each of the field lines $FL_j$ ($j=1, \ldots, 5$) is connected to and controlled by the control circuit 100.

A bit line $BL_i$ is disposed above and electrically connected to the memory cells $10_{i1}, 10_{i2}, 10_{i3}, 10_{i4}$ disposed on the i-th ($i=1, \ldots, 4$) row. The bit line $BL_i$ ($i=1, \ldots, 4$) is disposed along the direction in which the memory cells $10_{i1}, 10_{i2}, 10_{i3}$, and $10_{i4}$ in the i-th ($i=1, \ldots, 4$) row are arranged. Each of the bit lines $BL_i$ ($i=1, \ldots, 4$) is connected to and controlled by the control circuit 100.

As shown in FIG. 1B, each memory cell $10_{ij}$ ($i, j=1, \ldots, 4$) includes a magnetic memory line (magnetic member) $12_{ij}$ formed of a conductive magnetic material, a nonmagnetic conductive layer $13_{ij}$, a magnetoresistive element $14_{ij}$, a nonmagnetic conductive layer $16_{ij}$, and a switching portion $18_{ij}$.

The magnetic member $12_{ij}$ ($i, j=1, \ldots, 4$) is formed of a magnetic material having perpendicular magnetic anisotropy and has a tubular form extending in the vertical direction (z direction) in FIG. 1B. For example, the cross section of the magnetic member $12_{ij}$ ($i, j=1, \ldots, 4$) cut along a plane that is perpendicular to the z direction may have a circular, oval, or polygonal outer shape.

The magnetic member $12_{ij}$ ($i, j=1, 2$) includes a plurality of regions $12c_{ij}$ arranged in the z direction. Narrow portions $12d_{ij}$ are located on an outer surface of the magnetic member $12_{ij}$ between adjacent regions $12c_{ij}$. The regions $12c_{ij}$ ($i, j=1, 2$) have at least one magnetic domain. When a drive current (shift current) is supplied between a first end portion $12a_{ij}$ and a second end portion $12b_{ij}$ of the magnetic member $12_{ij}$ ($i, j=1, 2$), domain walls of the magnetic member $12_{ij}$ move in the z direction. When no drive current is supplied, the domain walls stay at the narrow portions $12d_{ij}$. The first end portion $12a_{ij}$ of the magnetic member $12_{ij}$ ($i, j=1, 2$) is electrically connected to the magnetoresistive element $14_{ij}$, and the second end portion $12b_{ij}$ is electrically connected to the corresponding bit line $BL_i$. The description "A is electrically connected B" herein means that A may be directly connected to B or indirectly connected to B via a conducting member. As shown in FIG. 1B, the nonmagnetic conductive layer $13_{ij}$ is disposed between the first end portion $12a_{ij}$ ($i, j=1, 2$) and the magnetoresistive element $14_{ij}$. The nonmagnetic conductive layer $13_{ij}$ may be used as the bit line.

The magnetoresistive element $14_{ij}$ ($i, j=1, \ldots, 4$) is configured to read information written to the magnetic member $12_{ij}$. For example, a magnetic tunnel junction (MTJ) element may be used as the magnetoresistive element $14_{ij}$. In the following descriptions, the magnetoresistive element $14_{ij}$ ($i, j=1, \ldots, 4$) is an MTJ element. The MTJ element $14_{ij}$ ($i, j=1, \ldots, 4$) includes a free layer $14a$ (magnetization free layer) in which the magnetization direction may be changed, a fixed layer $14c$ in which the magnetization direction is fixed, and a nonmagnetic layer $14b$ disposed between the free layer $14a$ and the fixed layer $14c$. In the MTJ element $14_{ij}$ ($i, j=1, \ldots, 4$), the free layer $14a$ is electrically connected to the first end portion $12a_{ij}$ of the magnetic member $12_{ij}$ via the corresponding nonmagnetic conductive layer $13_{ij}$, and the fixed layer $14c$ is electrically connected to the corresponding switching portion $18_{ij}$ via the corresponding nonmagnetic conductive layer $16_{ij}$. The feature that "the magnetization direction may be changed" herein means that in a read operation that will be described later, the magnetization direction may be changed by a stray magnetic field from the corresponding magnetic member $ML_{ij}$ ($i, j=1, \ldots, 4$), and the feature that "the magnetization direction is fixed" means that the magnetization direction is not changed by the stray magnetic field from the corresponding magnetic member $12_{ij}$ ($i, j=1, \ldots, 4$).

The switching portion $18_{ij}$ ($i, j=1, \ldots, 4$) is disposed between the nonmagnetic conductive layer $16_{ij}$ and a source line $SL_j$, and connected to the source line $SL_j$. The source line $SL_j$ ($j=1, \ldots, 4$) extends in a direction that crosses the paper plane of FIG. 1B. As shown in FIG. 1A, the source line $SL_j$ ($j=1, \ldots, 4$) is electrically connected to each of the switching portions of the memory cells $10_{ij}$ ($i=1, \ldots, 4$) arranged in the same column. Thus, the source line $SL_j$ ($j=1, \ldots, 4$) extends in a y direction shown in FIG. 1A. The source line $SL_j$ ($j=1, \ldots, 4$) is connected to and controlled by the control circuit 100 shown in FIG. 1A. The source line $SL_j$ may be the bit line. The direction in which each field line FL extends may be the same as or different from the direction in which the source line SL extends and the direction in which the bit line BL extends.

The switching portion $18_{ij}$ ($i, j=1, \ldots, 4$) may be, for example, a two-terminal switching element. When the value of a voltage applied across the two terminals is equal to or less than a threshold value, the switching portion $18_{ij}$ is in a "high-resistance" state, which is an electrically nonconductive state, for example. When the value of the voltage applied across the two terminals is more than the threshold value, the switching portion $18_{ij}$ is in a "low-resistance" state, which is an electrically conductive state, for example. When in the ON sate, the switching portion $18_{ij}$ keeps the ON state as long as a current having a value equal to or more than a holding current value flows. The switching portion $18_{ij}$ may have this function regardless of the polarity of the voltage. The switching portion $18_{ij}$ includes at least one chalcogen element selected from a group of Te, Se, and S. A chalcogenide, which is a compound of one or more of the above elements, may also be used. The switching portion $18_{ij}$ may also be formed of at least one of the elements selected from a group of B, Al, Ga, In, C, Si, Ge, Sn, As, P, and Sb.

(Write Operation)

A write operation of the magnetic memory according to the first embodiment will then be described.

An example in which data is written to the memory cell $10_{11}$ will be described. Write pulse currents are caused to flow in the opposite directions through the field line $FL_1$ and the field line $FL_2$. A magnetic field is generated by those write currents, which is used to control the magnetization in one of the regions $12c_{11}$ of the magnetic member $12_{11}$ near the field lines $FL_1$ and $FL_2$. Information (magnetization direction) is written in this manner. In the first embodiment, the write pulse currents have, for example, a triangular wave shape having a gradual gradient on the trailing portion. The control circuit 100 shown in FIG. 1A controls the currents flowing through the field lines $FL_1$ to $FL_3$.

The control circuit 100 then turns on the switching portion $18_{11}$ to cause a shift current to flow between the bit line $BL_1$ and the source line $SL_1$ to sequentially move the information written to the region $12c_{11}$ toward the first end potion $12a_{11}$ of the magnetic member $12_{11}$.

(Read Operation)

Next, a read operation for reading data from the memory cell $10_{11}$, for example, will be described below.

First, the control circuit 100 turns on the switching portion $18_{11}$ to cause a shift current to flow between the bit line $BL_1$ and the source line $SL_1$ in order to move the information written to the regions $12c_{11}$ of the magnetic member $12_{11}$ to the lowermost region $12_{c11}$ that is the closest to the MTJ element $14_{11}$. A read current is then caused to flow between the bit line $BL_1$ and the source line $SL_1$ to read the information. The free layer $14a$ of the MTJ element $14_1$, reacts to the stray magnetic field from the lowermost region $12c_{11}$ of the magnetic member $12_{11}$, that is the closest to the MTJ element $14_{11}$, and has a magnetization direction corresponding to the stray magnetic field. Therefore, the read information corresponds to the information stored in the lowermost region $12c_{11}$ of the magnetic member $12_{11}$, that is the closest to the MTJ element $14_{11}$.

The domain walls may move in the same direction as the shift current or in the direction opposite to the shift current. The moving direction of the domain walls may be controlled by such conditions as the material of the magnetic member, the material and the position of the conductive member on the magnetic member, and the manufacturing conditions. The conductive member on the magnetic member may be formed of Pt, W, or Ta. However, the material of the conductive member is not limited to those materials. The movement of the domain walls may be controlled by the spin orbit torque (SOT) effect that depends on the material of the conductive member.

Since the write current having a gradual gradient on the trailing portion of the waveform such as the write current having a triangular waveform flows through each of the field lines of the magnetic memory according to the first embodiment, the occurrence of a write error may be prevented. The reason why the write error may be prevented will be described below with reference to the result of an experiment.

(Experiment Result)

Figure 2:
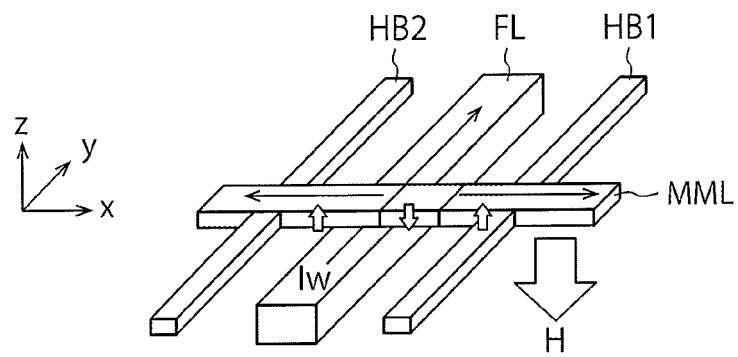
FIG. 2 is a perspective view illustrating a device used for an experiment for explaining the effect of each of magnetic memories according to the first to third embodiments.

FIG. 2 shows a device used for an experiment. This device includes a field line FL through which a write current flows, a magnetic memory line MML that crosses the field line FL, and two Hall bars HB1 and HB2 disposed on both sides of the field line FL and crossing the magnetic memory line MML. The magnetic memory line MML is connected to the Hall bars HB1 and HB2, and formed of the same material as the Hall bars HB1 and HB2. The field line FL and the magnetic memory line MML are electrically insulated from each other.

When a write current flows through the field line FL, information (magnetization direction) is written to a region of the magnetic memory line MML near the field line FL due to the magnetic field generated by the write current. After the information is written, an external magnetic field H is applied in a direction (z direction) that crosses the direction (x direction) in which the magnetic memory line MML extends and the direction (y direction) in which the field line FL extends. This extends the information-written region in the direction (x direction) in which the magnetic memory line MML extends. As a result, the polarity of the anomalous Hall voltage across the ends (the ends in the y direction) of each of the Hall bars HB1 and HB2 is reversed.

The reason why the region to which the information is written extends in the x direction when the external magnetic field H is applied in the z direction can be explained as follows. The magnetostatic energy U of the magnetic memory line MML in an external magnetic field may be expressed as $U=-M \cdot H$ where M denotes the magnetization of the magnetic memory line MML and H denotes the external magnetic field. The magnetostatic energy U is the most stable when the direction of the external magnetic field H and the direction of the magnetization M are parallel to each other, and the most unstable when they are antiparallel to each other. Therefore, when the external magnetic field H is applied in a downward direction (the negative direction on the z axis) to a region where the magnetization direction of the magnetic memory line MML is upward (the positive direction on the z axis), a toque is generated in a direction to reverse the magnetization direction of the magnetic domain. The boundaries (domain walls) of a magnetic domain receive a torque from the downward magnetization of adjacent magnetic domains in addition to the torque from the external magnetic field. As a result, the upward magnetization at the boundaries of the magnetic domain is reversed, and the region having the downward magnetization extends.

Figure 3A:
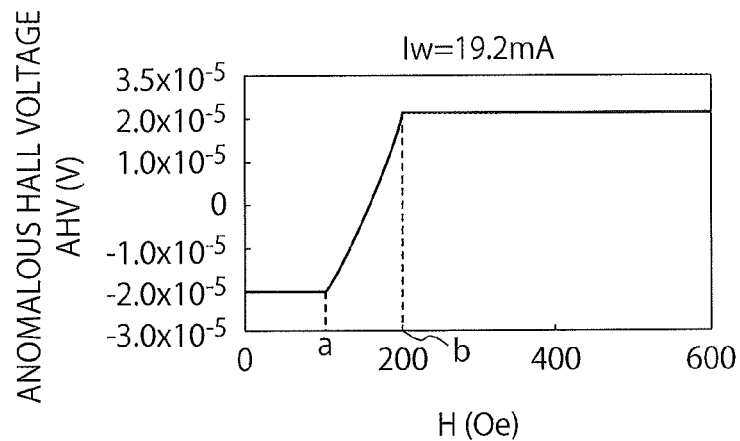
FIG. 3A is a diagram showing a characteristic of the device shown in FIG. 2.
Figure 3B:
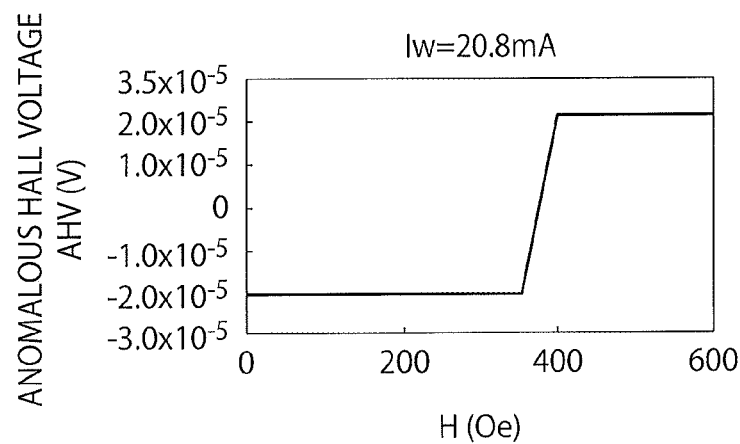
FIG. 3B is a diagram showing a characteristic of the device shown in FIG. 2.

FIG. 3A shows the result of the measurement of the anomalous Hall voltage AHV across the ends in the y direction of the Hall bar HB1 when a write pulse current Iw of 19.2 mA having a rectangular waveform is applied to the field line FL and the external magnetic field H is increased. FIG. 3B shows the result of the measurement of the anomalous Hall voltage AHV across the ends in the y direction of the Hall bar HB1 when a write pulse current Iw of 20.8 mA having a rectangular waveform is applied to the field line FL and the external magnetic field H is increased. The duration of the rectangular waveform is 1 psec.

As shown in FIG. 3A, when the write pulse current Iw of 19.2 mA flows through the field line FL and the external magnetic field H is increased from 0 Oe, the anomalous Hall voltage AHV is increased after the external magnetic field H reaches the value a (about 100 Oe) and saturated when the external magnetic field H reaches the value b (about 200 Oe). As the external magnetic field H is increased, the information written to the magnetic memory line MML diffuses in the x direction. When the external magnetic field H reaches a Oe, the information reaches the Hall bar HB1, and the anomalous Hall voltage AHV increases. When the external magnetic field H is increased further to reach b Oe, the anomalous Hall voltage AHV is saturated, and does not change any more if the external magnetic field H is further increased to be greater than b Oe. As can be understood from FIG. 3A, when the write pulse current Iw of 19.2 mA flows through the field line FL to write information to the magnetic memory line MML, the written information reaches the Hall bar HB1 if the external magnetic field H is increased to be greater than a Oe. This means that the write operation is completed when the external magnetic field H is greater than a Oe.

In contrast, as can be understood from FIG. 3B, when the write pulse current Iw of 20.8 mA flows through the field line FL, the anomalous Hall voltage AHV does not increase even if the external magnetic field H is increased from 0 Oe to 300 Oe or more. The anomalous Hall voltage AHV starts increasing after the external magnetic field H is increased beyond 350 Oe, and is saturated when the external magnetic field H reaches 400 Oe. Thus, in the case shown in FIG. 3B, when the write pulse current Iw of 20.8 mA flows, the write operation is not performed unless the external magnetic field H is greater than 350 Oe. This means that even if the same external magnetic field H is applied, and a large write pulse current having a rectangular waveform flows through the field line FL, information may not be written to the magnetic memory line as in the case shown in FIG. 3B. This will be described in more detail by referring to FIG. 4.

Figure 4:
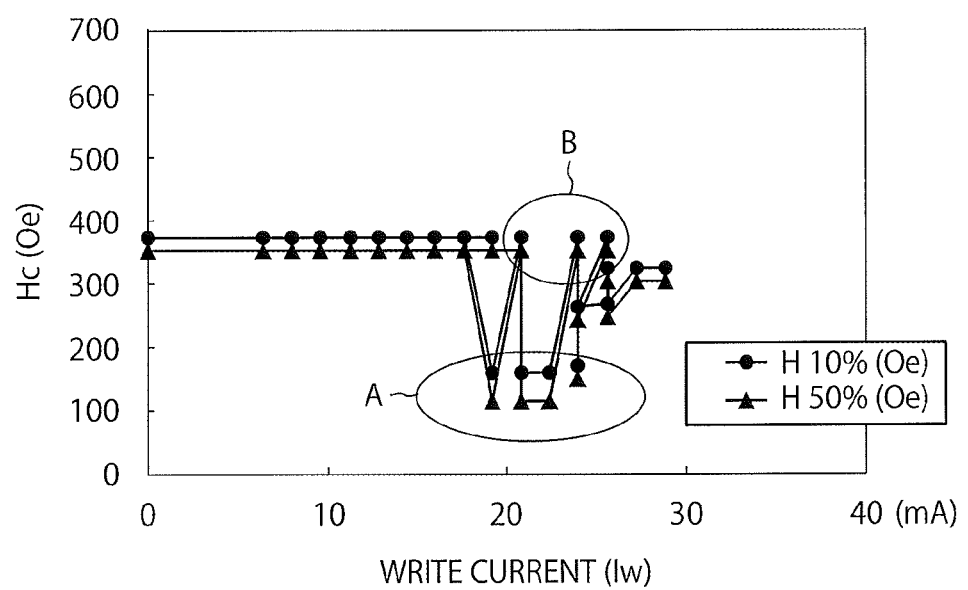
FIG. 4 is a diagram showing the result of a write operation using a rectangular write pulse performed by the device shown in FIG. 2.

FIG. 4 is a graph showing whether information is written to the magnetic memory line MML by measuring the anomalous Hall voltage AHV generated in the Hall bar HB1 when the external magnetic field H is H10% or H50% and the magnitude of the rectangular-wave write pulse current Iw flowing through the field line FL shown in FIG. 2 is changed. The horizontal axis indicates the write pulse current Iw, and the vertical axis indicates the reversal magnetic field Hc caused by flowing the write pulse current to the magnetic memory line MML. The reversal magnetic field Hc of the magnetic memory line MML is obtained by measuring the anomalous Hall voltage of the Hall bar HB1. The value H10% and the value H50% of the external magnetic field H satisfy the following conditions when the minimum value and the maximum value of the anomalous Hall voltage AHV shown in FIG. 3A are denoted by AHVa and AHVb, respectively.

H10%: AHVa+0.1(AHVb−AHVa)
H50%: AHVa+0.5(AHVb−AHVa)

As can be understood from FIG. 4, regardless of whether the external magnetic field H is H10% or H50%, the magnetization of the magnetic memory line MML is not reversed when the write pulse current Iw is equal to or less than 18 mA, but is at a constant value. However, when the write pulse current Iw exceeds 18 mA, sometimes the magnetization direction of the magnetic memory line MML is reversed, but sometimes it is not reversed. The state in which the magnetization direction of the magnetic memory line MML is revered and decreased (which is indicated by the oval A in FIG. 4) indicates that the information writing succeeds. The state in which the magnetization direction of the magnetic memory line MML does not change (which is indicated by the oval B in FIG. 4) indicates that the information writing fails. Thus, if the write pulse has a rectangular waveform, a write error may occur even if a current having a value that is greater than the threshold value of the write current flows through the field line.

Figure 5A:
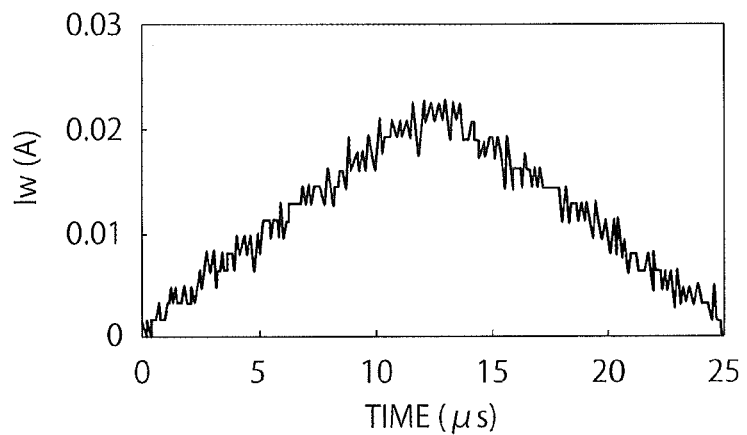
FIG. 5A is a diagram showing a triangular-waveform write pulse current used in a write operation performed by the device shown in FIG. 2.
Figure 5B:
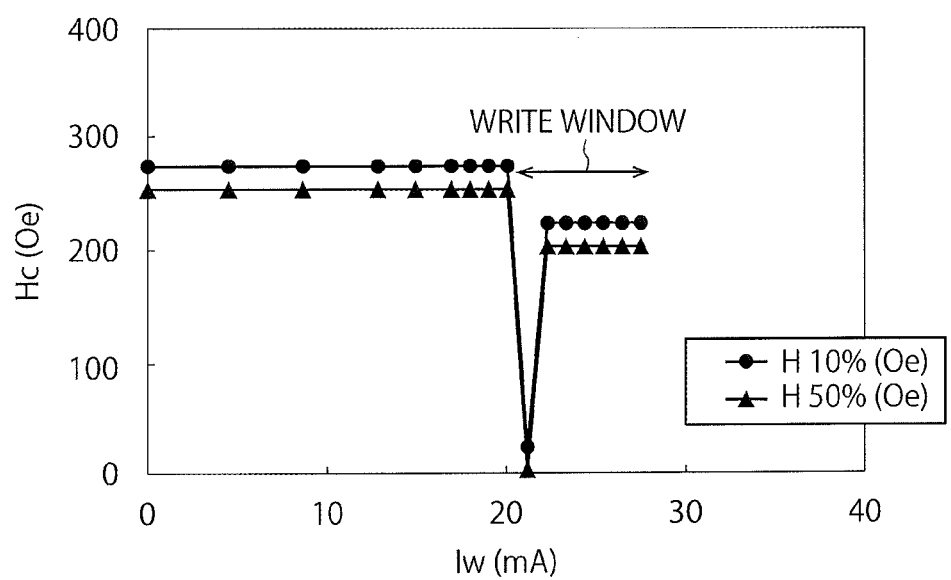
FIG. 5B is a diagram showing the result of a write operation using the write pulse shown in FIG. 5A.

The inventors of the present application studied hard to solve this problem, and considered that the occurrence of a write error may be prevented if a triangular-waveform write pulse current, for example, is used instead of a rectangular-waveform write pulse current. An experiment is then performed, in which a write pulse current having a triangular waveform as shown in FIG. 5A is caused to flow though the field line FL of the device shown in FIG. 2. FIG. 5B shows the result of the experiment.

FIG. 5B is a graph showing whether information is written to the magnetic memory line MML by measuring the anomalous Hall voltage AHV generated in the Hall bar HB1 when the external magnetic field H is H10% or H50%, and the magnitude of the write pulse current Iw having a triangular wave is caused to flow through the field line FL shown in FIG. 2. The horizontal axis indicates the write pulse current Iw, and the vertical axis indicates the reversal magnetic field Hc caused by writing information to the magnetic memory line MML.

As can be understood from FIG. 5B, regardless of whether the value of the external magnetic field H is H10% or H50%, the magnetization of the magnetic memory line MML is not reversed when the write pulse current Iw is equal to or less than 20 mA, but is at a constant value. When the write pulse current Iw exceeds 20 mA, however, the magnetization direction of the magnetic memory line MML is reversed and the reversal magnetic field decreases. This means that the information writing succeeds. Thus, a range (write window) is obtained, in which a stable writing operation may be performed.

The reason why a write error may be caused when the write pulse current has a rectangular waveform and the writing may succeed when the write pulse current has a triangular waveform, believed by the inventors of the present application, will be described with reference to FIGS. 6A to 7C.

Figure 6A:
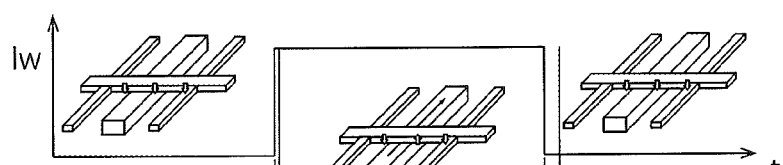
FIGS. 6A to 6C are diagrams used for explaining a write error that occurs when a rectangular write pulse is used.
Figure 6B:
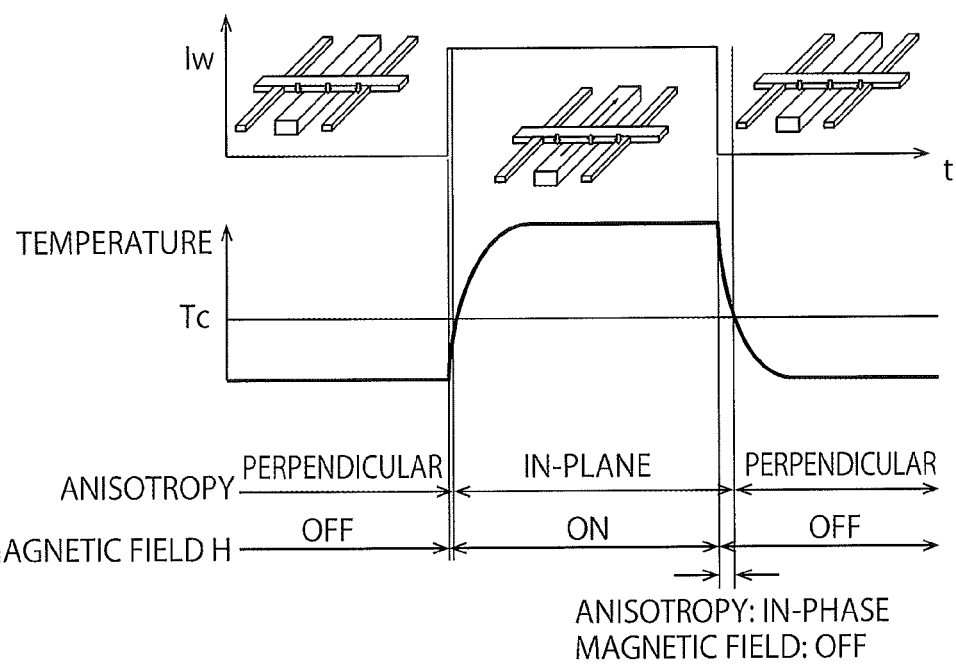
Figure 6C:
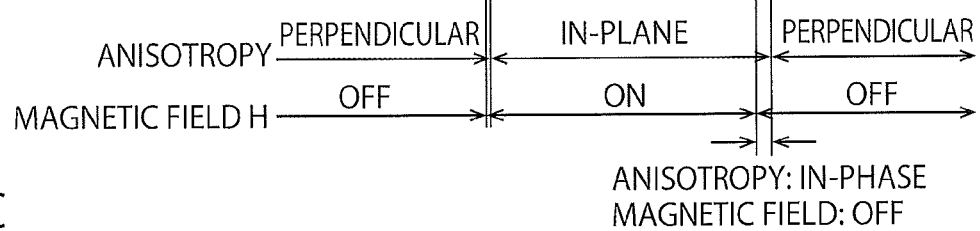

FIGS. 6A to 6C show that a write pulse current having a rectangular waveform is supplied to the field line FL shown in FIG. 2. FIG. 6A shows the rectangular-waveform write pulse current Iw. FIG. 6B shows the temperature of the field line FL when the write pulse current Iw is supplied, the temperature substantially indicating the temperature of the magnetic memory line MML. Since the magnetic memory line MML is disposed near the field line FL, the temperature of the magnetic memory line MML is substantially the same as that of the field line FL. FIG. 6C shows the magnetic anisotropy of the magnetic memory line MML and whether the external magnetic field is in the ON state or the OFF state.

Before the rectangular-waveform write pulse current is supplied, the external magnetic field H is in the OFF state and the magnetic memory line MML has a perpendicular magnetic anisotropy (FIG. 6C). The temperature of the magnetic memory line MML is not raised (FIG. 6B).

Then, the rectangular-waveform write pulse current Iw is caused to flow through the field line FL, and the external magnetic field H is brought into the ON state (FIGS. 6A and 6C). As a result, information is written to the magnetic memory line MML, and the temperature of the magnetic memory line MML increases. When the temperature of the magnetic memory line MML reaches the temperature Tc at which the magnetic anisotropy is lost, the magnetic anisotropy of the magnetic memory line MML changes to the in-plane magnetic anisotropy.

The write pulse current Iw is then turned OFF, and the external magnetic field H is brought into the OFF state. There is a period of time when the magnetic memory line MML decreases but does not reach the temperature Tc (FIGS. 6A, 6B, and 6C). The inventors of the present application consider that a write error may be caused when the information (magnetization direction) written to the magnetic memory MML is lost in the aforementioned period of time.

FIG. 7A to 7C show that a write pulse current having a triangular waveform is supplied to the field line FL shown in FIG. 2. FIG. 7A shows the triangular-waveform write pulse current Iw. FIG. 7B shows the temperature of the magnetic memory line MML when the write pulse current Iw is supplied. FIG. 7C shows the magnetic anisotropy of the magnetic memory line MML and whether the external magnetic field is in the ON or the OFF state.

Before the triangular-waveform write pulse current is supplied, the external magnetic field H is in the OFF state and the magnetic memory line MML has a perpendicular magnetic anisotropy (FIG. 7C). The temperature of the magnetic memory line MML is not raised (FIG. 7B).

Then, the triangular-waveform write pulse current Iw that is caused to flow through the field line FL is increased and the external magnetic field H is brought into the ON state (FIG. 7A, 7C). As a result, information is written to the magnetic memory line MML, and the temperature of the magnetic memory line MML increases. When the temperature of the magnetic memory line MML reaches the temperature Tc at which the magnetic anisotropy is lost, the magnetic anisotropy of the magnetic memory line MML changes to the in-plane magnetic anisotropy.

The write pulse current Iw is then decreased. As a result, the temperature of the magnetic memory line MML decreases. When the temperature of the magnetic memory line MML reaches the temperature Tc at which the magnetic anisotropy is lost, the magnetic anisotropy of the magnetic memory line MML changes to the perpendicular magnetic anisotropy. At this time, the external magnetic field H is still in the ON state. The write pulse current Iw is further decreased and brought into the OFF state, and the external magnetic field H is brought into the OFF state (FIGS. 7A and 7C).

When the triangular-waveform write pulse current is used, the external magnetic field H remains to be in the ON state in the period in which the magnetic anisotropy of the magnetic memory line changes from the in-plane magnetic anisotropy to the perpendicular magnetic anisotropy. The inventors of the present application believe that this is the reason why a write error is not caused. The inventors of the present application consider that the above explanation indicates that the change in the magnetocrystalline anisotropy magnetic field Hk of the magnetic memory line MML matches the timing model of timing at which the magnetic field H is applied to the field line FL.

An experiment similar to the experiment shown in FIG. 5B is then performed by using three pulse currents as the write pulse current Iw.

1) A pulse current having a steep rising gradient and a gradual trailing gradient, with a rising time shorter than a trailing time (for example, the rising time is 6 nsec, the peak duration is 1 μsec, and the trailing time is 12.5 μsec)

2) A pulse current having a gradual rising gradient and a gradual trailing gradient, with a rising time substantially the same as the trailing time (for example, the rising time and the trailing time are each 12.5 μsec, and the peak duration is 1 μsec)

3) A pulse current having a gradual rising gradient and a steep trailing gradient, with a rising time longer than a trailing time (for example, the rising time is 12.5 μsec, the peak duration is 1 μsec, and the trailing time is 6 nsec)

In the experiment, five measurements are performed with the external magnetic field being at H10%, and five measurements are performed with the external magnetic field being at H50%.

FIG. 8A shows the current pulse 1), and FIG. 8B shows the result of the experiment using the current pulse 1). When the current pulse 1) is used, a write window is generated as shown in FIG. 8B, which prevents the occurrence of a write error.

FIG. 9A shows the current pulse 2), and FIG. 9B shows the result of the experiment using the current pulse 2). When the current pulse 2) is used, a write window is generated as shown in FIG. 9B, which prevents the occurrence of a write error.

FIG. 10A shows the current pulse 3), and FIG. 10B shows the result of the experiment using the current pulse 3). When the current pulse 3) is used, no write window is generated as shown in FIG. 10B, and the occurrence of a write error cannot be prevented.

Figure 11:
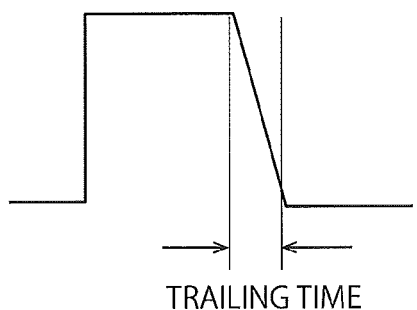
FIG. 11 is a waveform diagram used for explaining the trailing time.
Figure 12:
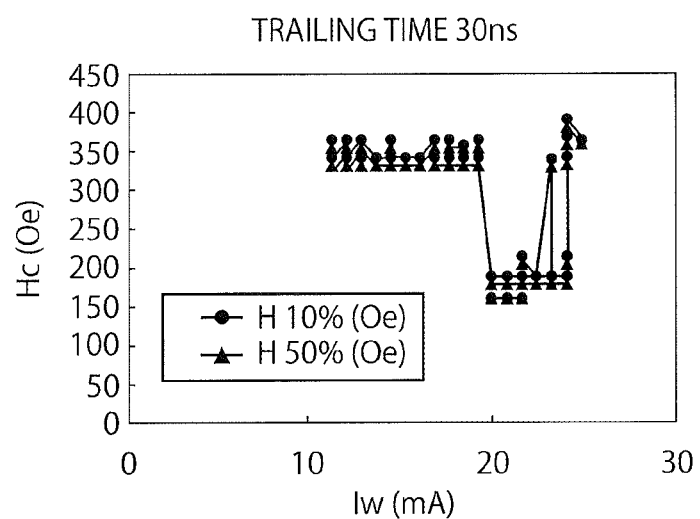
FIG. 12 is a diagram showing the result of a write operation using a write pulse having a tailing time of 30 nsec.
Figure 13:
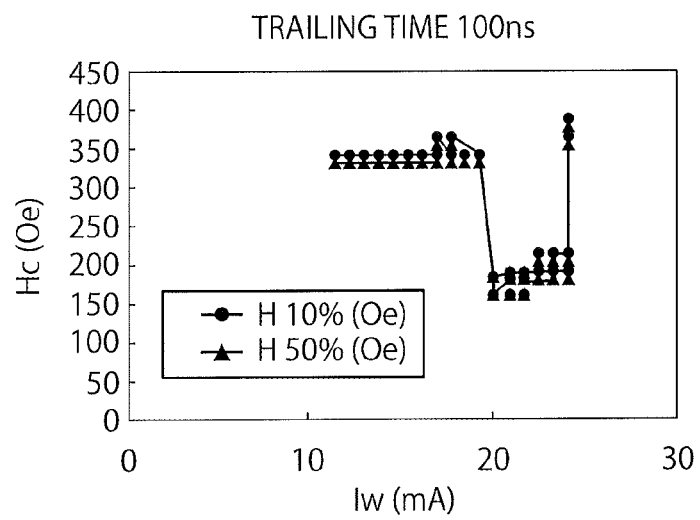
FIG. 13 is a diagram showing the result of a write operation using a write pulse having a trailing time of 100 nsec.

It can be understood from the above experiment results that a write pulse current in which the pulse rising time is longer than the pulse trailing time may prevent the occurrence of a write error. An experiment using a write current pulse having a steep rising gradient and a gradual trailing gradient as shown in FIG. 11 is performed in the same manner as the case with the result shown in FIG. 5B. The current pulse having the trailing time of 30 nsec and the current pulse having the current pulse having the trailing time of 100 nsec are used for the experiment. FIGS. 12 and 13 show the respective results. In the experiments, five measurements are performed with the value of the external magnetic field being at H10%, and five measurements are performed with the value of the external magnetic field being at H50%.

Figure 14:
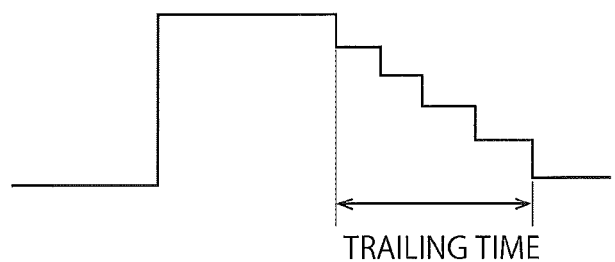
FIG. 14 is a waveform diagram of a current pulse having a stepwise trailing portion.

As can be understood from FIG. 12, if the current pulse having the trailing time of 30 nsec is used, substantially no write error occurs. As can be understood from FIG. 13, if the current pulse having the trailing time of 100 nsec is used, no write error occurs. Thus, the write error may be prevented if the trailing time of the write current is 30 nsec or more. The trailing portion does not necessarily have a smooth gradient but may have a step shape as shown in FIG. 14.

Figure 15:
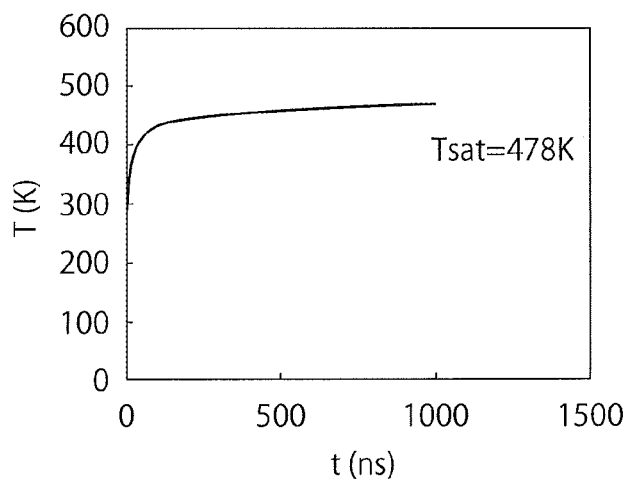
FIG. 15 is a diagram showing the temperature characteristic of the magnetic memory line of the device shown in FIG. 2.
Figure 16:
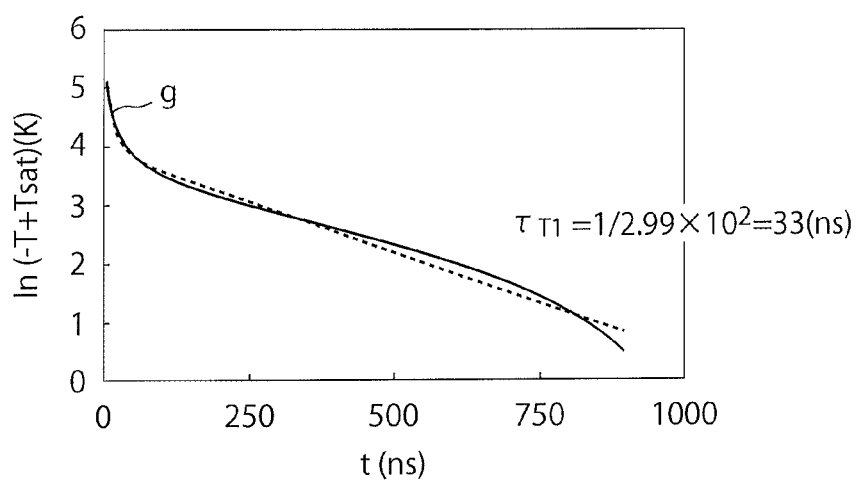
FIG. 16 is a diagram for obtaining a relaxation time of the temperature of the magnetic memory line included in the device shown in FIG. 2.

The inventors of the present application then considered that the trailing time of the write pulse current may relate to the relaxation time of the temperature of the magnetic memory line (thermal relaxation time). FIG. 15 shows the result of a temperature characteristic simulation performed on the magnetic memory line MML in a case where a write current Iw of 30 mA flows through the field line FL. When the write current Iw flows, the temperature T of the magnetic memory line MML rapidly is increased and saturated after 1000 nsec passes at a saturation temperature Tsat of 478 K (FIG. 15). FIG. 16 shows a graph obtained by changing the vertical axis of the temperature characteristic graph shown in FIG. 15 from the temperature T to the temperature ln(Tsat−T). The solid line in FIG. 16 shows ln(Tsat−T) converted from the temperature T. The broken line is obtained by approximating the solid line by using a formula. In the graph, ln( ) represents a natural logarithm. The part g of the broken line where the temperature rapidly increases can be expressed by the following formula where y represents the values on the vertical axis and x represents the values on the horizontal axis shown in FIG. 16.

$$y=-2.99\times10^{-2}\cdot x+5.14$$

From this formula, the thermal relaxation time T of the magnetic memory line MML can be obtained as T=1/2.99× $10^2$ (nsec)=33 (nsec).

It can be understood that the trailing time 30 (nsec) of the write pulse current shown in FIG. 12 is on substantially the same order as the thermal relaxation time τ of the magnetic memory line MML. From this and other features shown in FIGS. 12 and 13, it can be understood that the trailing time of the write pulse current is preferably longer than the thermal relaxation time τ of the magnetic memory line MML.

The thermal relaxation time τ of the magnetic memory line MML satisfies the following equation where the temperature of the magnetic memory line MML is denoted by T, and the time is denoted by t:

$$Tsat-T=Ce^{-t/\tau}$$

Therefore, it is possible to obtain the thermal relaxation time τ as an absolution value of the inverse number of the gradient of the part g in the graph shown in FIG. 16. The value C is a constant value determined by such factors as the material of the magnetic memory line MML.

As described above, the magnetic memory according to the first embodiment is capable of preventing the occurrence of a write error.

Second Embodiment

Figure 17:
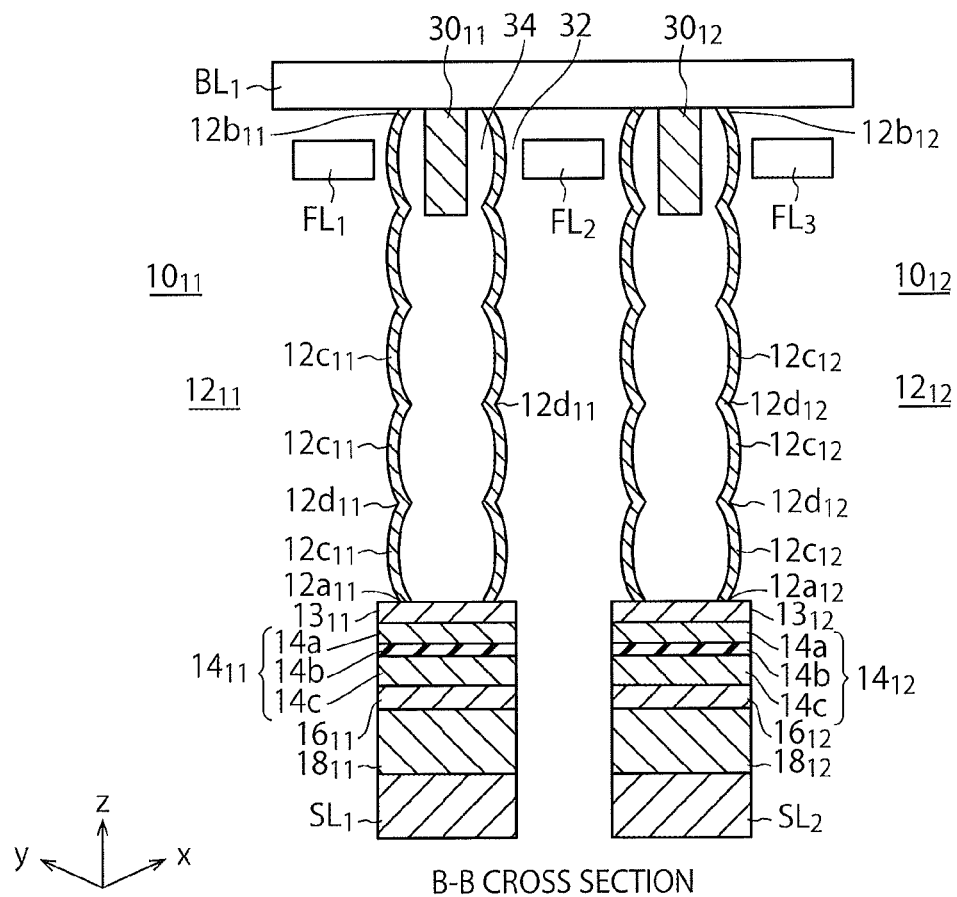
FIG. 17 is a cross-sectional view of a magnetic memory according to a second embodiment.

A magnetic memory according to a second embodiment will be described with reference of FIG. 17, which is a cross-sectional view of the magnetic memory according to the second embodiment. The magnetic memory according to the second embodiment additionally includes conductive members $30_{ij}$, the heat conductivity of which is higher than the insulating material of the magnetic members $12_{ij}$ (i, j=1, ..., 4) of the magnetic memory according to the first embodiment. It is preferable that each of the conductive members $30_{ij}$ (i, j=1, ..., 4) extends in the z direction with one end thereof being connected to the corresponding bit line $BL_j$, and the other end being located to be lower than the lower surface of the corresponding field line $FL_i$ when viewed in the z direction. The lower surface of the corresponding field line $FL_i$ is on the side that is opposite to the corresponding bit line $BL_j$. Therefore, it is preferable that the length of the conductive member $30_{ij}$ (i, j=1, ..., 4) in the z direction be longer than the distance from the corresponding bit line $BL_j$ to the lower surface of the field line $FL_i$.

The conductive member $30_{ij}$ disposed in each of the magnetic member $12_{ij}$ (i, j=1, ..., 4) allows the heat that is generated when the write current flows through the corresponding field line $FL_i$ to be conducted to the corresponding bit line $BL_j$ via a first insulating film 32, the magnetic member $12_{ij}$, a second insulating film 34, and the conductive member $30_{ij}$. As a result, the occurrence of a write error may be further prevented as compared with the first embodiment. The first insulating film 32 is disposed between each memory cell $10_{ij}$ (i, j=1, ..., 4) and the corresponding field lines, and the second insulating film 34 is disposed between each magnetic member $12_{ij}$(i, j=1, ..., 4) and the corresponding conductive member $30_{ij}$. The insulating material disposed in each magnetic member $12_{ij}$(i, j=1, ..., 4) may be a first insulating material that is disposed to be lower than the lower surface of the conductive member $30_{ij}$ and a second insulating material disposed to be higher than the lower surface of the conductive member $30_{ij}$, the first insulating material and the second insulating material being different materials. In such a case, it is preferable that the thermal conductivity of the second insulating material is higher than that of the first insulating material.

The material of each component will then be described below.

The magnetic member $12_{ij}$(i, j=1, ..., 4) is formed of a material having perpendicular magnetic anisotropy. Therefore, the easy magnetization axis of the magnetic member $12_{ij}$(i, j=1, ..., 4) is in a plane that is perpendicular to the z direction (first direction). The magnetic member $12_{ij}$ (i, j=1, ..., 4) is formed of a multi-layer film including, for example, cobalt and nickel. Other than cobalt and nickel, an alloy including an element selected from iron, cobalt, platinum, palladium, magnesium, and a rare earth element may be used to form the magnetic member $12_{ij}$(i, j=1, ..., 4).

The conductive member $30_{ij}$ (i, j=1, ..., 4) is formed of a metal material including at least one of W, Al, Cu, Ti, and Ta.

The first insulating film 32 is formed of silicon oxide or aluminum oxide. The second insulating film 34 is formed of such a material as silicon oxide, titanium oxide, hafnium oxide, magnesium oxide, or aluminum oxide. If the second insulating film 34 is formed of a material having heat conductivity that is better than the heat conductivity of silicon oxide, for example aluminum oxide, the conductive member $30_{ij}$ (i, j=1, ..., 4) may be may not be provided.

A method of manufacturing the magnetic memory according to the second embodiment will then be described with reference to FIGS. 18 to 24.

Figure 18:
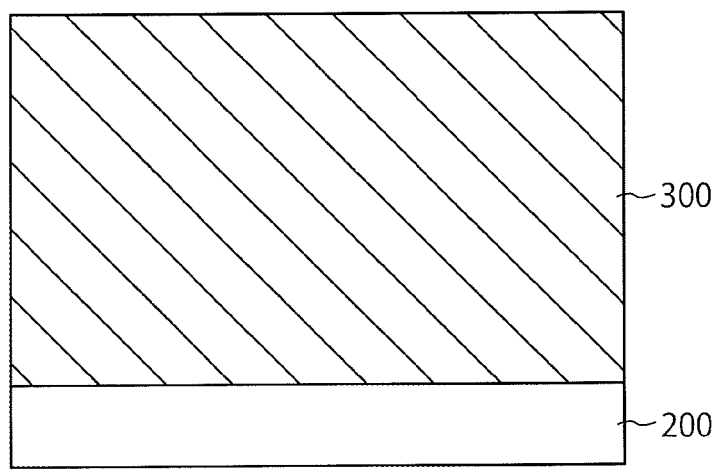
FIGS. 18 to 24 are cross-sectional views showing the steps of manufacturing the magnetic memory according to the second embodiment.
Figure 19:
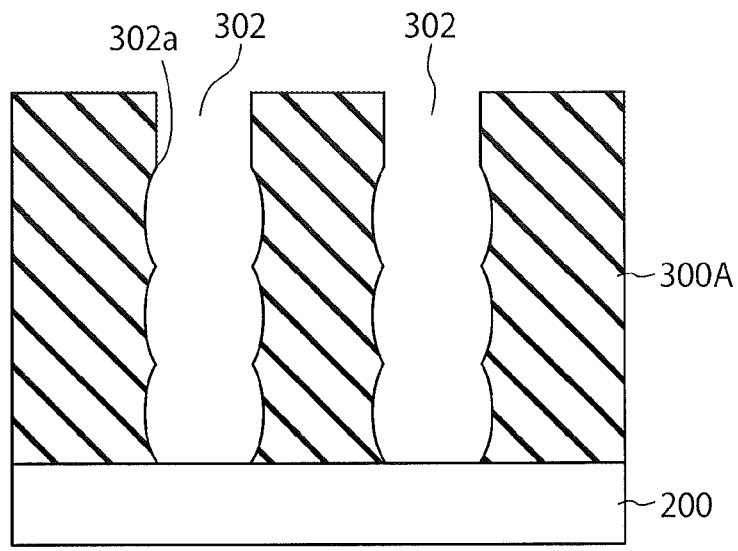

First, a metal layer 300 of aluminum oxide, for example, is formed on a silicon substrate 200. Alternatively, a silicon substrate 200 is bonded with a substrate 300 of aluminum (FIG. 18). Subsequently, the metal layer 300 is anodized. The anodization is performed by causing a current to flow in an electrolytic solution (including any or a combination of sulfuric acid, oxalic acid, and phosphoric acid) with one of the metal layer 300 and the silicon substrate 200 being set as an anode. At this time, the metal layer (aluminum) is oxidized to generate metal ions and to dissolve. The metal ions are bonded with oxygen in the electrolytic solution to form a metal oxide (aluminum oxide), which grows on the surface of the metal layer 300. Since the dissolving and the growing proceed at the same time, minute holes 302 surrounded by aluminum oxide are formed on the surface of the metal layer 300 of aluminum. A first voltage is applied during the formation of the holes 302, and a second voltage that is different from the first voltage is periodically applied. While the second voltage is being applied, portions 302a, which have a smaller dimension in the x direction and the y direction (diameter) shown in FIG. 2 are formed. The aluminum around regions where the holes 302 are formed changes to aluminum oxide 300A (FIG. 19).

Figure 20:
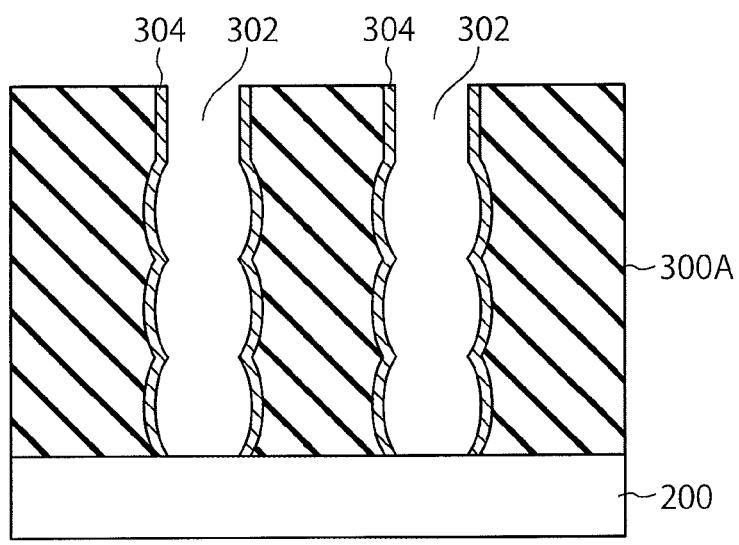
Figure 21:
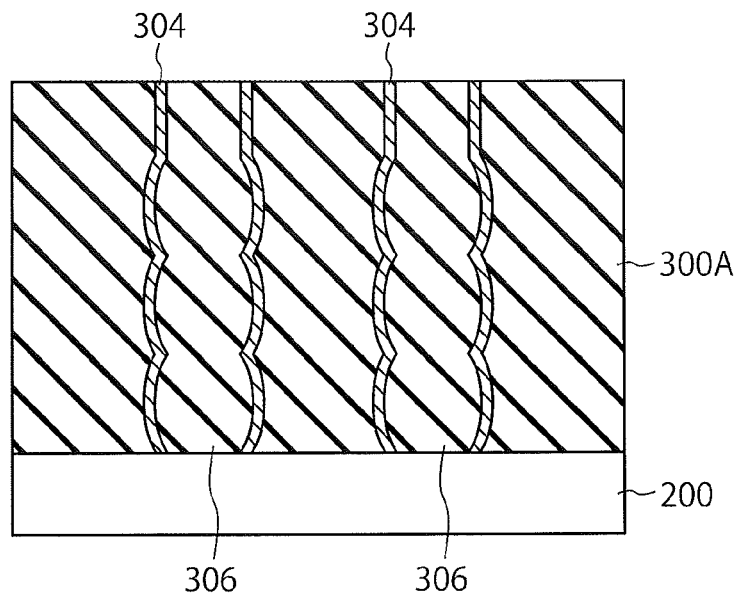

A magnetic layer 304 is then formed to cover the inner surface of each hole 302 as shown in FIG. 20. The magnetic layer 304 serves as the magnetic members $12_1$, and $12_{12}$ shown in FIG. 1B. Thereafter, as shown in FIG. 21, an insulating film of a nonmagnetic material (for example, silicon oxide film) 306 is filled into the holes 302.

Figure 22:
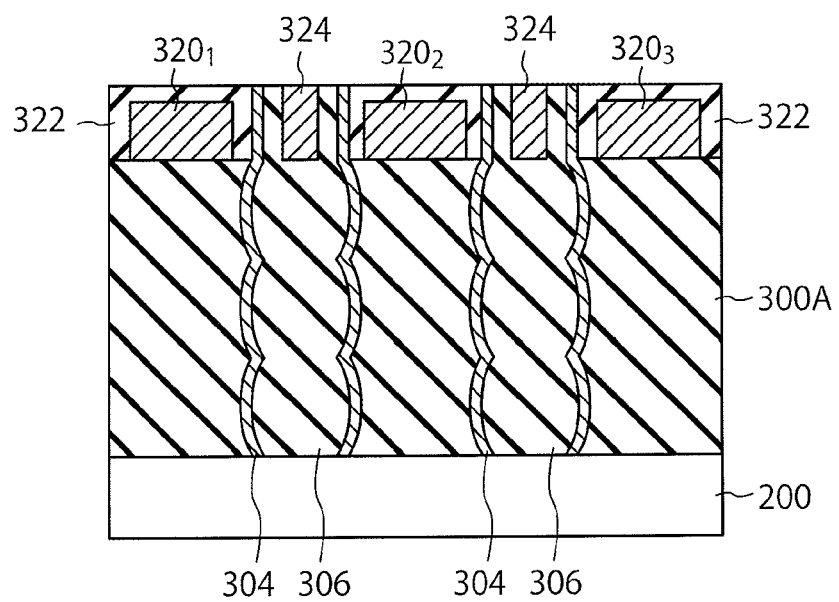

Subsequently, the aluminum oxide 300A is etched and then wirings $320_1$, $320_2$, and $320_3$ to become field lines $F_1$, $F_2$, $F_3$ are formed as shown in FIG. 22. Thereafter, an insulating film 322 of a nonmagnetic material including silicon oxide is formed to cover the wirings $320_1$, $320_2$, and $320_3$. Then, grooves are formed in the insulating film 306 covering the hoes 302. The grooves are filled with a metal material having a high heat conductivity, including at least one of W, Al, Cu, Ti, and Ta, to form an embedded metal film 324.

Figure 23:
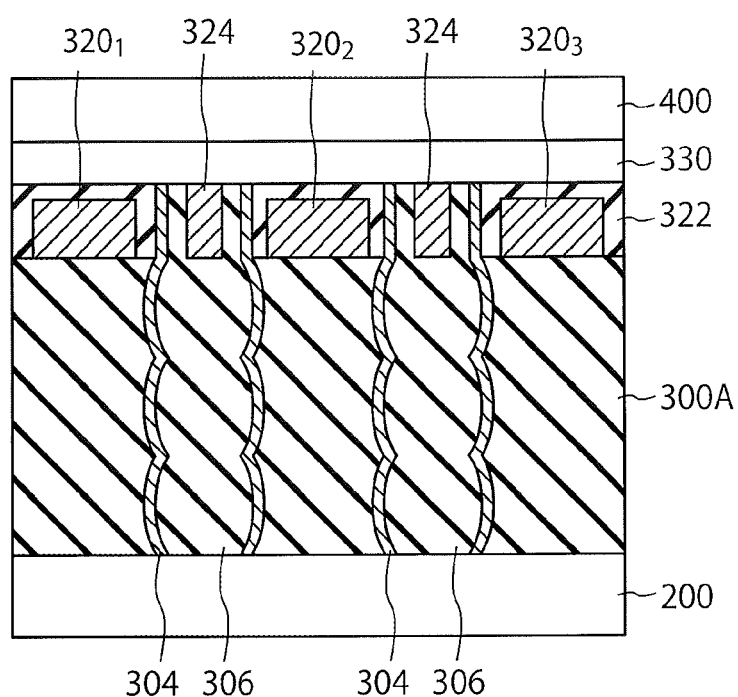

Next, as shown in FIG. 23, a wiring 330 connecting to the magnetic layer 304 and the metal film 324 is formed. The wiring 330 will be the bit line $BL_1$ shown in FIG. 1B. Subsequently, an insulating film of a nonmagnetic material (for example, silicon oxide film) that is not shown is formed to cover the wiring 330. The insulating film is polished by chemical mechanical polishing (CMP) to expose the surface of the wiring 330. A CMOS circuit including the control circuit 100 shown in FIG. 1 is then formed on another substrate 400. The substrate 400 with the CMOS circuit is reversed and joined to the substrate on which the magnetic layer 304 and the wiring 330 are formed, as shown in FIG. 23. Specifically, the surface of the substrate 400 on which the CMOS circuit is formed is bonded with the surface on which the wiring 330 are formed. The wirings 330, $320_1$, $320_2$, and $320_3$ shown in FIG. 16 are electrically connected to the CMOS circuit.

The silicon substrate 200 is then polished from the backside by CMP, for example, to expose the surface of the aluminum oxide 300A. At this time, the end portion of the magnetic layer 304 is also exposed. Subsequently, nonmagnetic conductive layers $340_1$ and $340_2$ that are electrically connected to the magnetic layer 304 are formed on the exposed surface of the aluminum oxide. Thereafter, an insulating film of a nonmagnetic material (for example, silicon oxide film) 342 is formed to cover the nonmagnetic conductive layers $340_1$ and $340_2$. The insulating film 342 is then polished by CMP, for example, to expose the surfaces of the nonmagnetic conductive layers $340_1$ and $340_2$. MTJ elements $516_1$ and $516_2$ that are electrically connected to the exposed nonmagnetic conductive layers $340_1$ and $340_2$ are then formed. Each MTJ element $516_i$ (i=1, 2) includes a fixed layer 514 in which the magnetization direction is fixed, a free layer 510 in which the magnetization direction may be changed, the free layer 510 being disposed between the fixed layer 514 and the wiring $500_i$, and a nonmagnetic insulating layer (tunnel barrier layer) 512 disposed between the fixed layer 514 and the free layer 510.

Figure 24:
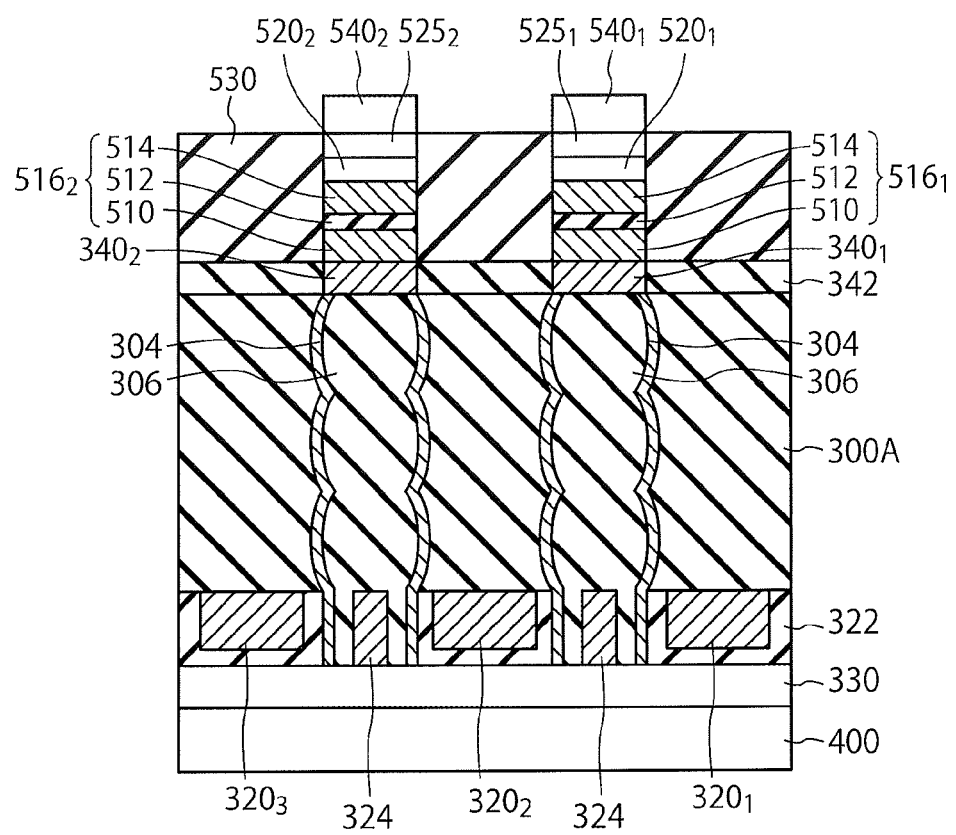

Thereafter, as shown in FIG. 24, an insulating film 530 of a nonmagnetic material (for example, silicon oxide film) is formed to cover the MTJ elements $516_1$ and $516_2$. Subsequently, openings are formed in the insulating film 530 by a lithographic technique so that the top surface of the fixed layer 514 included in each of the MTJ elements $516_1$ is $516_2$ is exposed. Nonmagnetic conductive layers $520_1$ and $520_2$ each connecting to the corresponding fixed layer 514 are formed in the openings, and switching portions $525_1$ and $525_2$ electrically connected to the nonmagnetic conductive layers $520_1$ and $520_2$ are formed. The nonmagnetic conductive layers $520_1$ and $520_2$ will be the nonmagnetic conductive layers $161_1$ and $16_{12}$ shown in FIG. 1B, and the switching portions $525_1$ and $525_2$ will be the switching portions $18_{11}$ and $18_{12}$ shown in FIG. 1B. Thereafter, wirings $540_1$ and $540_2$ electrically connected to the switching portions $525_1$ and $525_2$ are formed. The wirings $540_1$ and $540_2$ will be the source lines $SL_1$ and $SL_2$ shown in FIG. 1B. An insulating film of a nonmagnetic material (for example, silicon oxide film), which is not shown, is then formed to cover the wirings $540_1$ and $540_2$, and polished by CMP. The MTJ elements $516_1$ and $516_2$ and the wirings $540_1$ and $540_2$ are electrically connected to the CMOS circuit formed on the substrate 400 by means of vias embedded in the minute holes (for example, the holes 302 shown in FIG. 19) formed in the aluminum oxide 300A. The holes in which the vias are embedded are not the holes in which the magnetic layer 304 is formed in the step shown in FIG. 20. However, a magnetic layer may be formed in the holes. The magnetic layer formed here will be a dummy magnetic layer. The magnetic memory according to the second embodiment is manufactured by the aforementioned manner.

Since the write current flowing through the field line of the magnetic memory according to the second embodiment has a gradual trailing gradient like that of the first embodiment, the second embodiment is capable of preventing the occurrence of a write error, like the first embodiment.

Third Embodiment

Figure 25:
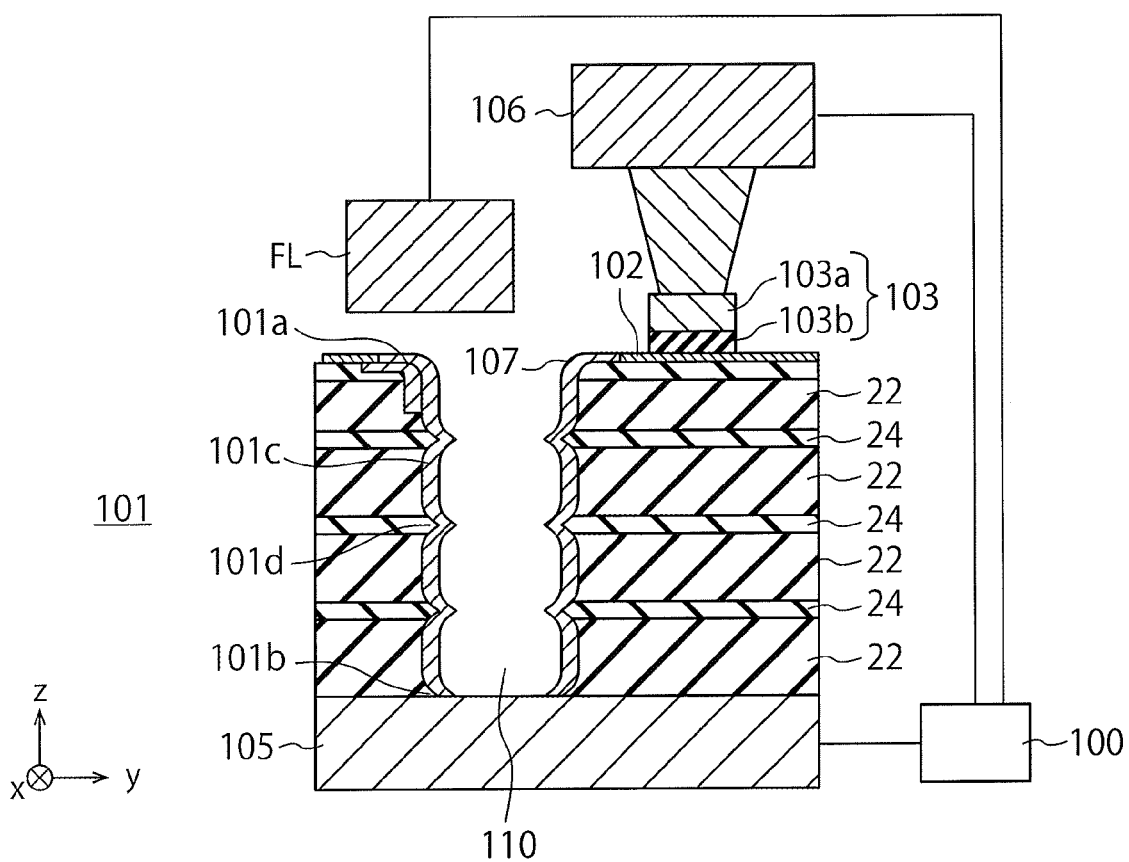
FIG. 25 is a cross-sectional view of a magnetic memory according to a third embodiment.

FIG. 25 shows a magnetic memory according to a third embodiment. In the magnetic memory according to the first embodiment or the second embodiment, the field line is disposed to a region near the side portion of the magnetic member. In the third embodiment, however, the field line is disposed above the magnetic member.

The magnetic memory according to the third embodiment includes a first magnetic member 101 having a tubular shape with a hollow portion 110, a second magnetic member 102, and a third magnetic member (connecting portion) 107 that connects the first magnetic member 101 and the second magnetic member 102. The first magnetic member 101 extends in a z direction (upwards in FIG. 25). The first magnetic member 101 is formed of a material having perpendicular magnetic anisotropy. Therefore, the easy magnetization axis is in a plane that is perpendicular to the z direction (first direction). The hollow portion 110 may be filled with a nonmagnetic insulating material (for example, silicon oxide, silicon nitride, or alumina).

The first magnetic member 101 extends in the z direction, and has a first portion (end portion) 101a and a second portion (end portion) 101b. The first portion 101a of the first magnetic member 101 is connected to an end portion of the second magnetic member 102. The second magnetic member 102 is disposed to surround the end portion 101a. A magnetoresistive element 103 (for example, magnetic tunnel junction (MTJ) element) is disposed on the second magnetic member 102. An electrode 106 is electrically connected to the top surface of the magnetoresistive element 103, the top surface being on the side of the magnetoresistive element 103 opposite to the second magnetic member 102. An electrode 105 is electrically connected to the end portion 101b of the first magnetic member 101. The cross section of the first magnetic member 101 cut along a plane that is perpendicular to the z direction may have a circular, oval, or polygonal outer shape.

The magnetoresistive element 103 includes a magnetization fixed layer 103a in which the magnetization is fixed, the magnetization fixed layer 103a facing at least a part of the second magnetic member 102, and a nonmagnetic layer 103b disposed between the magnetization fixed layer 103a and the part of the second magnetic member 102. A field line FL is disposed near a part of the second magnetic member 102 that is on the opposite side of the hollow portion relative to the part of the second magnetic member 102 on which the magnetoresistive element 103 is disposed. Information (magnetization direction) is written to the first magnetic member 101 by causing a current to flow through the field line FL to write the information (magnetization direction) to the second magnetic member 102 disposed near the field line FL by using the magnetic field generated by the current. Therefore, the field line FL is disposed in a region that is at a distance from the second magnetic member 102 that allows the writing of information by means of the magnetic field generated by the current. The write current supplied to the field line is the same as that used in the first embodiment, and supplied from the control circuit 100.

The information is read by causing a current between the electrode 105 and the electrode 106 via the magnetoresistive element 103 by means of the control circuit 100.

The first magnetic member 101 includes a plurality of regions (fifth portions) 101c arranged in the z direction. The regions 101c are separated from each other by narrow portions (sixth portions) 101d disposed on the outer surface of the first magnetic member 101. The regions 101c have at least one magnetic domain. When a drive current (shift current) is supplied between the electrode 106 and the electrode 105 from the control circuit 100, domain walls of the first magnetic member 101 move (shift) in the z direction by spin transfer torque. When no drive current is supplied, the domain walls stay at the narrow portions 101d. The outer diameter of the cross section of each of the regions 101c cut along a first plane that is perpendicular to the z direction is greater than the outer diameter of the cross section of each of the narrow portions 101d cut along a second plane that is perpendicular to the z direction. The cross-sectional area of each of the regions 101c cut along the first plane perpendicular to the z direction is larger than the cross-sectional area of each of the narrow portions 101d cut along the second plane perpendicular to the z direction.

An insulating film 22 is disposed on the opposite side of each of the regions 101c relative to the hollow portion 110 in a y direction (horizontal direction in FIG. 25) of the magnetic memory, and an insulating film 24 is disposed on the opposite side of each of the narrow portions 101d relative to the hollow portion 110. Thus, the regions 101c are disposed between the hollow portion 110 and the insulating films 22, and the narrow portions 101d are disposed between the hollow portion 110 and the insulating films 24. An x direction, which will be described later, is perpendicular to the z direction and the y direction.

The first magnetic member 101 and the third magnetic member 107 are each formed of a multi-layer film including, for example, cobalt and nickel. Other than cobalt and nickel, an alloy including an element selected from iron, cobalt, platinum, palladium, magnesium, and a rare earth element may be used to form the first magnetic member 101 and the third magnetic member 107. The second magnetic member 102 is formed of a magnetic element such as iron or cobalt.

Information (magnetization direction) is written to the first magnetic member 101 by causing a current to flow through the field line FL disposed near the second magnetic member 102 to write the information to the second magnetic member 102. The information is read by causing a current between the electrode 105 and the electrode 106 via the magnetoresistive element 103. The write current is supplied to the field line from the control circuit 100. The write current has a gradual trailing gradient, like that of the first embodiment.

In the magnetic memory having such a configuration, the insulating films 22 and 24 have different etching rates and are alternately stacked to form a multilayer structure. The hollow portion 110 is formed through the multilayer structure. If the material of the insulating films 22 has a higher etching rate than the material of the insulating films 24, for example, the insulating films 22 are etched faster than the insulating films 24 when the hollow portion 110 is formed. The portions where the insulating films 22 are etched become recesses, and the portions where the insulating films 24 are etched become projections. Therefore, the side surface of the hollow portion 110 has projections and recesses. Thereafter, the edge of the uppermost insulating film on the hollow portion side is rounded. Thereafter, a magnetic material is deposited on the side surface of the hollow portion 110 and the top surface of the uppermost insulating film. As a result, the second magnetic member 102 is formed on the uppermost insulating film, the third magnetic member 107 is formed at the edge portion of the uppermost insulating film on the hollow portion side, and the first magnetic member 101 is formed on the side surface of the hollow portion 110.

As described above, since the write current flowing through the field line in the magnetic memory according to the third embodiment is the same as the write current of the first embodiment, the occurrence of a write error may be prevented, as in the first embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A magnetic memory comprising:
a first wiring and a second wiring;
a first magnetic member including a first portion electrically connected to the first wiring and a second portion electrically connected to the second wiring, the first magnetic member extending in a first direction from the first portion to the second portion;
a third wiring that is electrically insulated from the first magnetic member; and
a control circuit electrically connected to the first wiring, the second wiring, and the third wiring, the control circuit supplying a current pulse, in which a trailing time is longer than a rising time, to the third wiring.

2. The magnetic memory according to claim 1, wherein the trailing time is equal to or longer than 30 nsec.

3. The magnetic memory according to claim 1, wherein the current pulse falls stepwise.

4. The magnetic memory according to claim 1, wherein the trailing time is equal to or longer than a thermal relaxation time of the first magnetic member.

5. The magnetic memory according to claim 1, further comprising a first magnetoresistive element disposed between the first portion and the first wiring,
wherein the second wiring extends in a second direction that crosses the first direction, the first wiring extends in a third direction that crosses the first direction and the second direction, and the third wiring is at a distance from the second portion and extends in a direction that crosses the first direction.

6. The magnetic memory according to claim 1, wherein the first magnetic member has a shape of a tube extending in the first direction.

7. The magnetic memory according to claim 6, wherein the first magnetic member has a circular, oval, or polygonal outer peripheral shape in a cross section taken along a plane that is perpendicular to the first direction.

8. The magnetic memory according to claim 6, further comprising:
a conductive member disposed in the tube and electrically connected to the second wiring; and
an insulating material disposed between an inner surface of the first magnetic member and the conductive member.

9. The magnetic memory according to claim 8, wherein the conductive member includes at least one element selected from the group consisting of W, Al, Cu, Ti, and Ta.

10. The magnetic memory according to claim 6, further comprising an insulating material disposed in the tube, connecting to the second wiring, and having a higher heat conductivity than silicon oxide.

11. A magnetic memory comprising:
a first magnetic member including a first portion and a second portion, and extending in a first direction from the first portion to the second portion;
a second magnetic member extending in a second direction that crosses the first direction, the second magnetic member being connected to the first magnetic member;
a first electrode electrically connected to the first portion;
a second electrode electrically connected to the second magnetic member;
a magnetoresistive element disposed between the second magnetic member and the second electrode;
a wiring electrically insulated from the first magnetic member and the second magnetic member; and
a control circuit electrically connected to the first electrode, the second electrode, and the wiring, the control circuit supplying a current pulse, in which a trailing time is longer than a rising time, to the wiring.

12. The magnetic memory according to claim 11, wherein the trailing time is equal to or longer than 30 nsec.

13. The magnetic memory according to claim 11, wherein the current pulse falls stepwise.

14. The magnetic memory according to claim 11, wherein the trailing time is equal to or longer than a thermal relaxation time of the second magnetic member.

15. The magnetic memory according to claim 11, wherein the first magnetic member has a shape of a tube extending in the first direction.

16. The magnetic memory according to claim 15, wherein the first magnetic member has a circular, oval, or polygonal outer peripheral shape in a cross section taken along a plane that is perpendicular to the first direction.

17. A magnetic memory comprising:
a first wiring and a second wiring;
a first magnetic member including a first portion electrically connected to the first wiring and a second portion electrically connected to the second wiring, and extending in a first direction from the first portion to the second portion;
a third wiring that is electrically insulated from the first magnetic member; and
a control circuit electrically connected to the first wiring, the second wiring, and the third wiring, the control circuit supplying a current pulse, in which a trailing time is equal to or longer than 30 nsec.

18. The magnetic memory according to claim 17, wherein the current pulse falls stepwise.

19. The magnetic memory according to claim 17, wherein the trailing time is equal to or longer than a thermal relaxation time of the first magnetic member.

20. The magnetic memory according to claim 17, further comprising a first magnetoresistive element disposed between the first portion and the first wiring,
wherein the second wiring extends in a second direction that crosses the first direction, the first wiring extends in a third direction that crosses the first direction and the second direction, and the third wiring is at a distance from the second portion and extends in a direction that crosses the first direction.

21. The magnetic memory according to claim 1, wherein the first magnetic member comprises a plurality of regions between the first portion and the second portion, and a plurality of narrow portions on an outer surface of the first magnetic member between the regions,
the regions have at least one magnetic domain.

22. The magnetic memory according to claim 17, wherein the first magnetic member comprises a plurality of regions between the first portion and the second portion, and a plurality of narrow portions on an outer surface of the first magnetic member between the regions,
the regions have at least one magnetic domain.

* * * * *